United States Patent [19]

McBrearty et al.

[11] Patent Number: 4,558,596
[45] Date of Patent: Dec. 17, 1985

[54] APPARATUS FOR DETECTING MISSING WIRES

[75] Inventors: Michael McBrearty, Philadelphia, Pa.; Michael Negin, Cinnaminson, N.J.; I. Marvin Weilerstein; Albert J. Zielenski, both of Philadelphia, Pa.

[73] Assignee: Kulicke and Soffa Industries Inc., Horsham, Pa.

[21] Appl. No.: 544,874

[22] Filed: Oct. 24, 1983

[51] Int. Cl.$^4$ .................. G01M 7/00; B23K 1/06
[52] U.S. Cl. .................... 73/588; 228/1.1; 228/4.5; 228/10
[58] Field of Search .............. 73/588; 228/1 R, 1 A, 228/103, 104, 4.5, 10, 110; 156/64, 73.2, 378, 580.1

[56] References Cited

U.S. PATENT DOCUMENTS

| | | | |
|---|---|---|---|
| 3,784,079 | 1/1974 | Spanjer | 228/1 R |
| 3,852,999 | 10/1974 | Wright | 73/588 |
| 4,047,657 | 9/1977 | Mims | 228/110 |
| 4,341,574 | 7/1982 | Landes | 228/1 R |
| 4,479,386 | 10/1984 | Beggs et al. | 73/588 |

Primary Examiner—Stewart J. Levy
Assistant Examiner—John E. Chapman, Jr.
Attorney, Agent, or Firm—John B. Sowell

[57] ABSTRACT

Apparatus is provided for monitoring the bond condition of a fine aluminum wire being ultrasonically bonded to an electrode pad. The apparatus comprises a counter for generating a start and stop signal indicative of a predetermined plurality of cycles from the ultrasonic generator of the ultrasonic bonder. A stable source of pulses is applied to a second counter which is started and stopped by the start and stop signal. The count stored in the second counter is read out to a microprocessor and is indicative of the frequency of the ultrasonic generator during the bonding operation. A plurality of frequency readings are taken and measured during the formation of an ultrasonic wedge bond and this information is employed to calculate a bond quality rating which accurately predicts whether a good bond has been made or some condition exists indicating that a good bond has not been made.

8 Claims, 5 Drawing Figures

APPARATUS FOR DETECTING MISSING WIRES

BACKGROUND OF THE INVENTION

1. Field of the Invention

This invention relates to fine wire bonders employed to make electrical connections between electrodes or pads on semiconductor devices and lead out pads. More specifically the present invention relates to an apparatus for detecting whether the bonder has made a proper bond on the electrodes or pads.

2. Description of the Prior Art

One of the problems associated with making fine wire bonds on semiconductors is the desirability of determining whether a good or proper bond is made. Bad bonds may be caused by improper deformation of the wire being bonded, improper adhesion of the wire to the pads or electrodes of the semiconductor device being bonded, or no bond may occur because the wire is missing. Numerous solutions have been proposed for automatically determining whether a proper bond has been made. Since the wire being bonded at first bond is looped and again bonded at the second bond, a length of wire is employed to make the loop. It has been suggested that the wire spool on which the bond wire is stored must move in order to supply the length of wire being employed to make the interconnection between the first and second bond, thus, sensing the spool motion is one way of determining whether the first and second bond was made. However, this does not give any indication of the quality of the bond and most probes and indicators formerly employed created inertia and drag on the wire spool which created as many problems as solutions.

In order to overcome the problems associated with sensing the motion of the spool on which the fine wire is stored, attempts were made to positively drive and pay out fine wire from the spool employing a drive motor on the spool. This method of attempting to detect missing wires does not give any indication of the quality of the bond. This method requires placing tension in the wire path between the spool and the bonding wedge. It is possible to get a kick-back or undesired pull on the wire which will remove the fine wire from the bonding wedge and cause a missing wire.

It has been suggested that the resistance at the interface of the bond and the electrode on a semiconductor may be monitored so as to determine whether the bond has been properly made. However, employing electrical energy in the wire at the wire bond may possibly damage the semiconductor device.

It is known that the current being supplied to the ultrasonic transducer which is employed to make ultrasonic wire bonds has a distinctive pattern which may be employed to determine whether a good wire bond has been made. For example, the current supplied the ultrasonic transducer increases up to a time which is approximately half of the bonding time and if a good bond is being made the curve slowly falls off requiring less current drive to the transducer. If the bond is being made without wire the current being supplied the ultrasonic transducer continues to increase out to the end of the bonding time. This principle has been employed to detect whether proper bonds are being made. However, when a curve of current versus time is employed to detect whether a wire bond is being made properly, it requires that a graphic plot be made and high and low points on the current versus bonding time curve be designated in order to establish logic levels for sensing whether a good bond is made. This method of graphically setting high and low logic points on a current versus bonding time curve has other problems because the curves may have reverse inflection points and differ from bond to bond.

It would be desirable to provide an apparatus for automatically determining whether a good fine wire bond is being made by an ultrasonic wire bonder during the time that the bond is actually being made. It would also be extremely desirable to provide a simplified structure for indicating the quality of each bond being made while automatically determining whether the wire is missing under the working face of the bonding tool.

SUMMARY OF THE INVENTION

It is a principal object of the present invention to provide a novel missing wire detector.

It is another principal object of the present invention to provide a novel apparatus for determining and indicating the quality of fine wire bonds being made by an ultrasonic wire bonder.

It is another object of the present invention to provide apparatus for detecting frequency data while a fine wire bond is being made and to calculate a bond quality rating for the wire bond.

It is another object of the present invention to provide novel apparatus for calculating a large number of bond quality ratings and for calculating the average and standard deviation of a plurality of bond quality ratings.

It is yet another object of the present invention to provide novel apparatus for automatically indicating and displaying the fact that a fine wire is missing from under the working face of an ultrasonic wire bonding tool and/or that an improper bond has been made.

It is a general object of the present invention to employ the data calculated concerning the quality of a wire bond being made to generate a signal which is employed to stop the ultrasonic wire bonder operation.

According to these and other objects of the present invention there is provided apparatus for sensing the frequency and frequency shift of the generator voltage while a fine wire bond is being made by an ultrasonic wire bonder. The frequency and frequency shift is stored in the memory of a processor adapted to analyze the frequency data and to indicate if a good wire bond has been made.

DESCRIPTION OF THE PREFERRED EMBODIMENT

Before explaining in detail the novel missing wire detector it will be understood that the present invention is preferably used in association with an automatic ultrasonic wedge wire bonder of the type employed to make aluminum wire interconnections between pads and electrodes on semiconductor devices. Such automatic wire bonders are well known in the art such as a Model 1470 automatic wire bonder presently made and sold by Kulicke and Soffa Industries, Inc. in Horsham, Pa.

While the preferred embodiment of the present invention is applicable to ultrasonic wedge wire bonders, and specifically to bonding of aluminum wire, the invention is also applicable to the making of second bonds employing capillary type bonding tools where a wire is bent under the 360 degree annular shaped wedge of a capillary bonding tool employed for ball bonding the first wire bond and ultrasonically wedge bonding the second wire bond. The present invention may be employed to sense missing wires at such second bonds or improper bonds.

Figure 1:
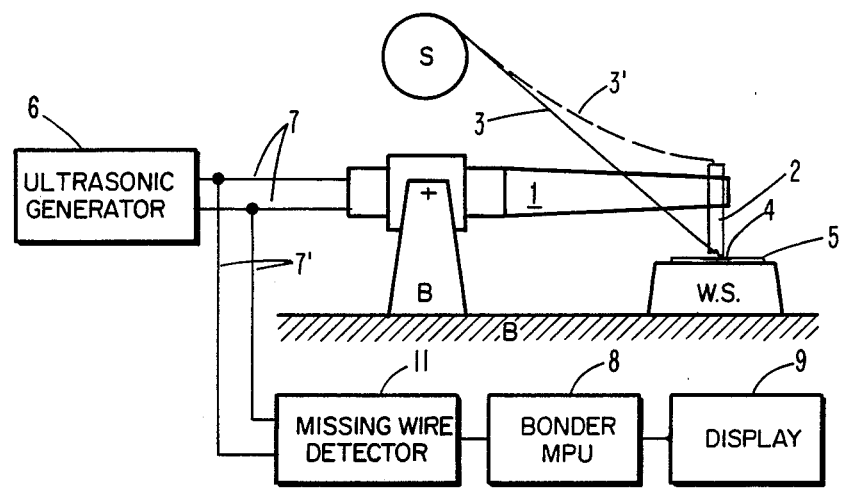
FIG. 1 is a schematic block diagram of an ultrasonic wire bonder showing a transducer and generator.

Refer to FIG. 1 showing an ultrasonic transducer 1 of the type adapted to hold a preferred embodiment wedge bonding tool 2. The fine wire 3 is fed through a guide at the rear of the tool and emerges as a tail or small length of wire under the working face of the bonding tool to enable a proper bond to be made. If the wire is not properly aligned under the working face of bonding tool 2, a proper bond cannot be made to the pad 4 on the semiconductor device 5. When a capillary bonding tool (not shown) is employed, the wire 3 from wire spool S is fed through the capillary opening at the top as shown by wire path 3'.

When a wire bond is being made with either type wedge bonding tool, ultrasonic generator 6 applies a current via lines 7 to the ultrasonic transducer 1. Pressure is applied to wire 3 by tool 2 to ultrasonically bond wire 3 to pad 4 of semiconductor 5 on workstation W.S. which is supported by base B.

A pair of parallel lines 7' are employed to sense the voltage, and the frequency, of ultrasonic generator 6 at missing wire detector 11. Missing wire detector 11 is coupled to the bonding processor 8 in the wire bonder. Bonder processor 8 is coupled to a display panel 9 which may be an integral part of the processor bonder 8 or may be a separate display as will be explained hereinafter.

Figure 2:
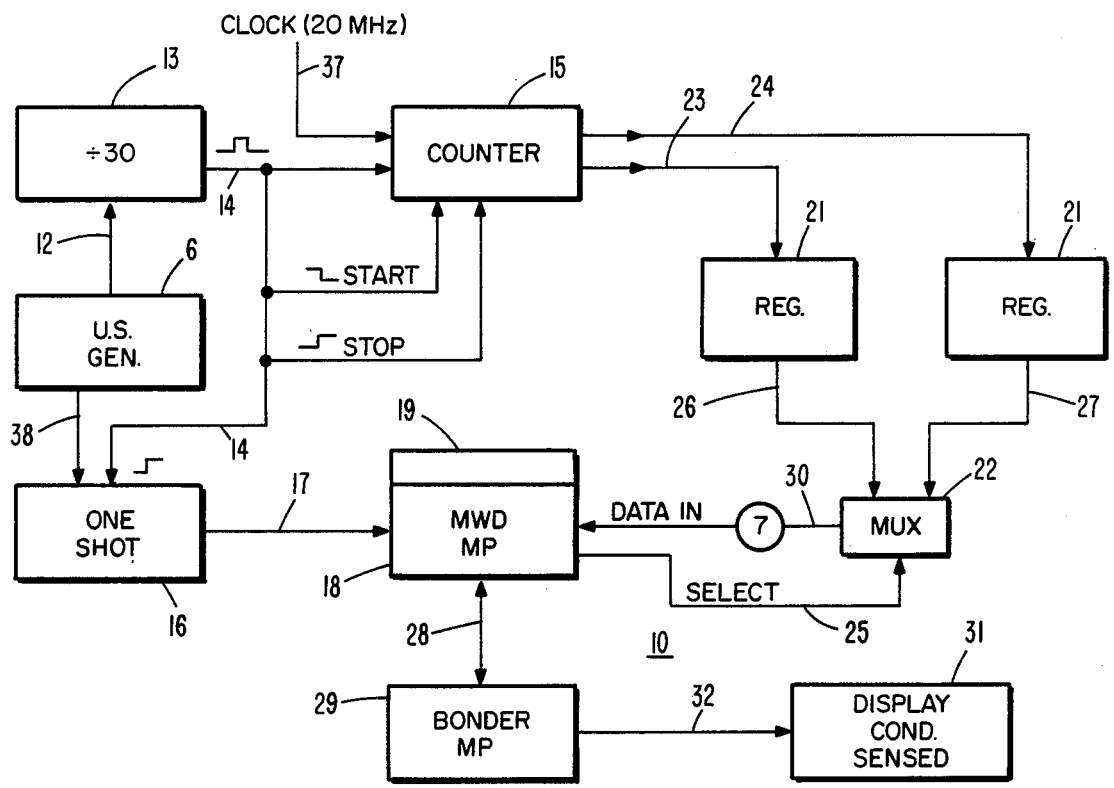
FIG. 2 is a schematic block diagram showing the present invention missing wire detector.

Refer now to FIG. 2 showing a missing wire detector system 10 in simplified block diagram. The ultrasonic generator 6 employed to drive the ultrasonic transducer 1 produces a sinusoidal voltage signal on line 12 which is applied to a step-down counter 13 employed to divide the frequency pulses by a factor of thirty. The counter 13 produces a square wave voltage on output line 14 which is employed in three different ways in the present system. The trailing edge of the square wave pulse on line 14 is employed as a trigger for starting counter 15. The leading edge of the next following pulse of the pulses on line 14 is employed to generate a stop signal applied to counter 15. The leading edge of each of the square wave pulses on line 14 is also applied to a one-shot multivibrator 16 which is set to generate an approximately eight microsecond signal on line 17 which is applied to the missing wire detector microprocessor 18. The signal on line 17 is employed to interrupt the microprocessor 18 and to inform the microprocessor 18 that there is data available from counter 15 which may be sensed and stored in the memory or registers 19 of the microprocessor 18. In the preferred embodiment of the present invention an inexpensive microprocessor 18 is employed which has an 8 bit data path. In order to utilize accuracy of the data being generated by counter 15 in processor 18 a pair of registers 21 are employed to alternately store the data being supplied on lines 23 and 24 from counter 15. The microprocessor 18 produces a select signal on line 25 which is applied to the multiplexer 22 to choose an input of 7 bits from line 26 or line 27. The data is transferred via line 30 and applied to the missing wire detector microprocessor 18, then stored as 14 bits in the memory means 19. As will be explained in greater detail hereinafter the microprocessor 18 is employed to make calculations indicative of the bond quality rating of each of the bonds being made by the automatic wedge wire bonder of FIG. 1. When the bond quality rating of the bond being made is indicative of the fact that the bond is improper, or the wire is missing, a signal is generated on line 28 to the bonder microprocessor 29 which enables the bonder microprocessor to cease the bonding operation. It may be desirable to indicate on a display panel 31 the bond quality rating of the bond which causes the microprocessor to stop the bonding operation. The signal on line 32 to display 31 is preferably an interrupt signal and the condition sensed is preferably displayed on the bonder microprocessor display panel.

Figure 3:
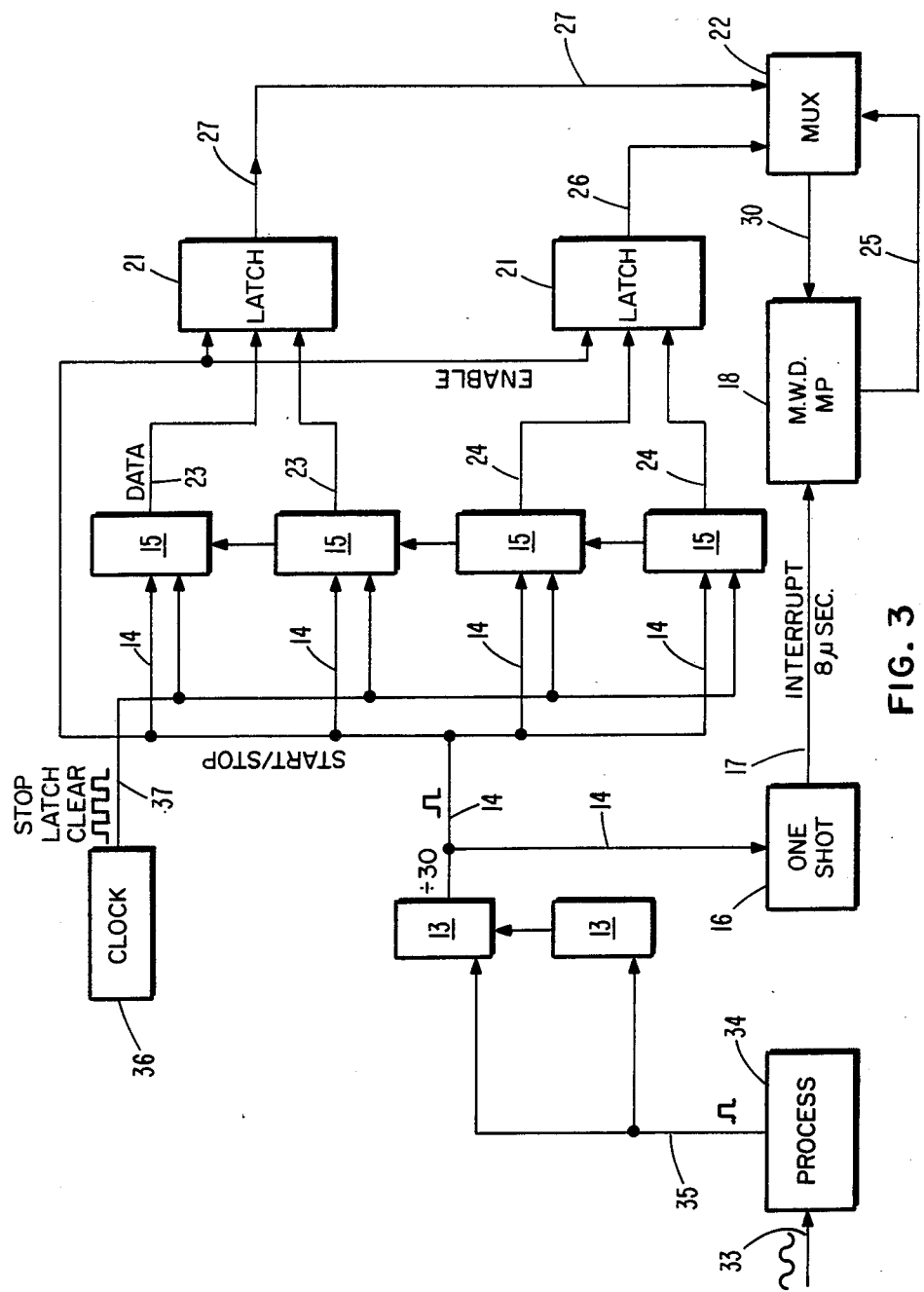
FIG. 3 is a more detailed block diagram of the missing wire detector showing the counters and latches employed.

Refer now to FIG. 3 showing the counters and latches employed in a preferred embodiment missing wire detector. A sinusoidal voltage signal on line 33 is processed and shaped in attenuator processor 34 to produce a square wave signal on line 35. The square wave signal is applied to the modulo 30 counters 13 which produce a square wave signal every thirty pulses of the sinusoidal input on line 33. The output from the modulo 30 counters on line 14 is applied to the one-shot multivibrator 16 and the output on line 17 is applied to the missing wire detector microprocessor 18. The square wave pulse on line 14 is employed as described hereinbefore to start and stop the counting operation of the high speed counters 15. The start and stop signal on line 14 will permit the high speed counters 15 to store a number of clock pulses being produced by clock 36. It will be understood that the number of clock pulses stored in high speed counters 15 during the start and stop interval is indicative of the frequency of the ultrasonic generator voltage signal on lne 33. In the preferred mode of operation, after the square wave signal is sensed on line 14, three high speed clock signals from clock 36 on line 37 are employed to synchronize the sequential logic operations: stop, latch and clear. The frequency data from the output of high speed counters 15 on lines 23 and 24 are applied to the latches 21 which act as buffer registers. The aforementioned multiplexer 22 reads the information stored in latches 21 which is then stored in the memory of the missing wire detector microprocessor 18 via line 30.

Having explained the operation of the FIG. 2 and FIG. 3 of a preferred embodiment, it will be understood that the ultrasonic generator 6 is activated during the bonding operation. The signal on line 38 from ultrasonic generator 6 is applied to the one-shot multivibrator 16 indicating that a bonding operation is taking place. A plurality of frequency readings are taken during each bonding operation and this data on line 30 is supplied to the missing wire detector microprocessor 18 where it is constantly being collected, stored and analyzed to compute the aforementioned bond quality ratings.

In the preferred embodiment it is desirable to perform a learning operation of a large number of bonds on each type of bonding surface to be bonded. The bonds being made at the outer leads are learned separately and distinctly from the bonds being made at the lead pads on the semiconductor device. This information is employed to make comparisons between the wire bonds being made when production semiconductor devices are being bonded.

Figure 4:
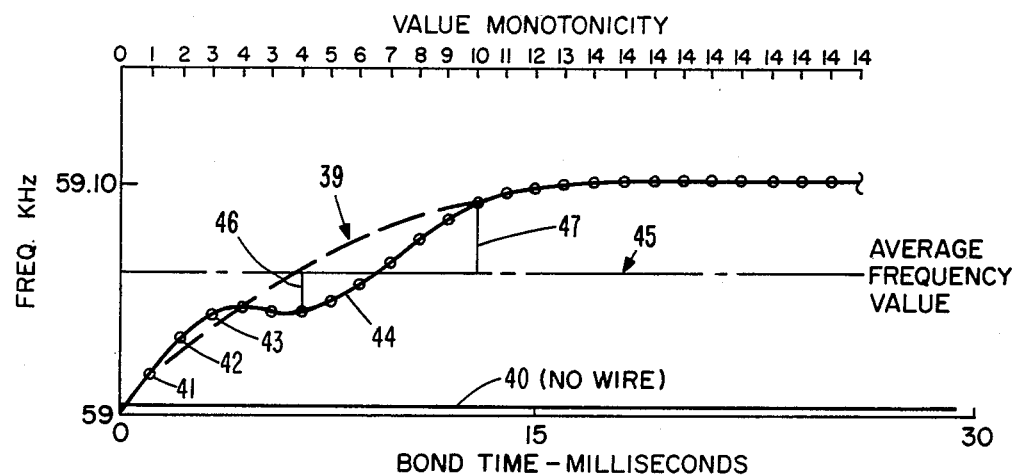
FIG. 4 is a curve of generator frequency versus bonding time showing a plurality of points on the curve where information is obtained and stored by the novel missing wire detector.

Refer now to FIG. 4 showing a curve of frequency versus bonding time. Curve 40 is indicative of the response when the wire is missing. Curve 39 shown in dashed line is indicative of an ideal bonding condition. It will be noted that the frequency being sensed at each of the points 41, 42, 43, etc. increases with bonding time until the proper bond is made and the frequency being sensed ceases to change.

In actual practice it has been observed that the plot of frequency during bonding time does not follow the ideal curve 39 but instead often rises above the curve 39 and then reverses and goes below the curve 39 as shown in curve 44. A value of monotonicity may be calculated from the frequency points 41, etc. Each time the frequency increases as shown from point 41 to point 42 and from 42 to point 43 the value of monotonicity increases by a factor of one. Similarly, the value of monotonicity decreases by a factor of one with a frequency decrease. Thus, the definition of monotonicity at any point in time is the number of frequency increases minus the number of frequency decreases.

After a bonding operation occurs it is possible to calculate the average frequency value in hertz for all of the frequency points of the entire bond as shown by line 45. It is also possible to calculate the magnitude of the frequency deviations in hertz at each of the frequency points as shown at deviation points 46 and 47. The deviation data shown at points 46 and 47 is employed to calculate a variance factor which is herein described as being the average value of the squares of the deviations from the average frequency line 45 for the complete bond. A complete bond may require 15 to 30 milliseconds. Approximately fifty frequency readings may be taken during each bonding operation. The deviation at the start of the bond is approximately −50 hertz and decreases as it approaches the average value line 45 where it starts to increase to approximately +50 hertz. The sum of the squares of these values is the variance factor.

It is now possible to calculate a bond quality rating which is indicative of whether a good bond or a bad bond has been made. For the preferred embodiment of this application, bond quality rating is equal to the sum of the weighted monotonicity and variance of the frequency curve. The weighting factor is preferably determined by dividing the average variance factor for good bonds by the average of the monotonicity for good bonds. The weighting factor is multiplied by the smaller monotonicity value, thus, the two values employed for determining bond quality ratings will have equal effect and weight. While a simplified preferred embodiment bond quality rating is described, it will be understood that other methods of calculating a bond quality rating may be employed to determine whether the actual bond curve 44 has deviated from the ideal bond curve 39 so as to indicate if the wire is missing under the working face of the bonding tool, if a proper bond has not been made and if other conditions exist which indicate that the electrical value of the bond is not proper for proper operation of the semiconductor device.

Figure 5:
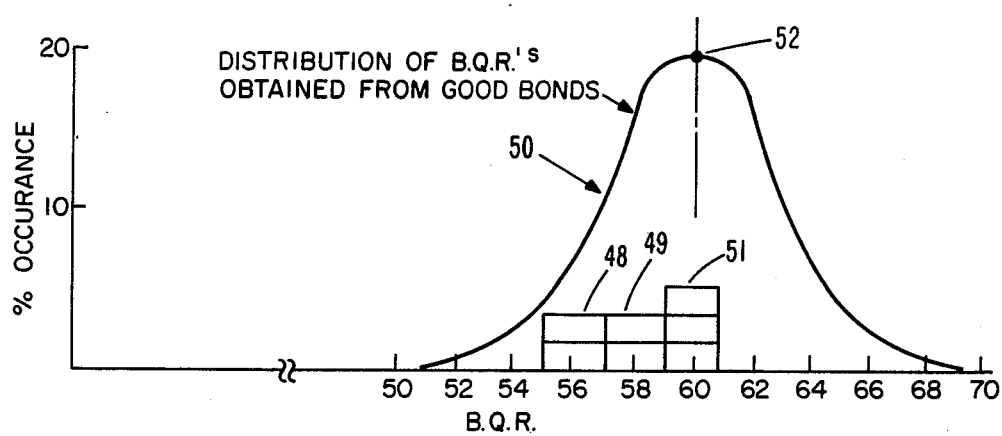
FIG. 5 is a curve showing the distribution of a plurality of bond quality ratings for a plurality of different wire bonds.

Refer now to FIG. 5 showning a distribution curve 50 of a plurality of bond quality ratings for a plurality of different bonds made on a similar semiconductor device. The bond quality rating for a typical bond obtained by employing the above mentioned calculations may be a dimensionless number near sixty. It will be understood that this number may be scaled to any desired magnitude as long as the relative ratings between bonds remain proportional. The percentage occurrence of a particular bond quality rating is maximum at the average value of the bond quality ratings. It has been observed that the distribution of bond quality ratings are approximately normal or Gaussian so that the distribution on either side of the average is substantially symmetrical. A simplified explanation of the manner in which the FIG. 5 curve may be generated is to assign areas such as rectangles 48, 49 and 51 to each of the bond quality rating occurrences. When these areas are completely mapped in graphically they will produce a Gaussian distribution curve 50 as shown in FIG. 5.

The bond quality rating distribution curve 50 may be defined with two numbers. A mean or average as shown at point 52 defines the location of the peak of the curve 50, thus, indicating the most frequently occurring bond quality ratings. A second number may be employed to define the amount of spread of the distribution curve 50. Standard mathematical deviations from average or norm may be employed for this purpose. A typical value of a standard deviation for a distribution curve of the type shown in FIG. 5 is usually a value under the magnitude of ten. In the preferred embodiment of the present invention all of the good bonds fall under the distribution curve 50. Those bonds which fall to the left well outside of the distribution curve 50 are deemed to be improper bonds or missing wires.

Having explained the operation of a preferred embodiment missing wire detector which employs a plurality of frequency readings during the time a bond is being made, it will now be understood that this information is capable of immediately indicating whether a good bond is made or a missing wire has occurred. The preferred embodiment of the present invention is completely automatic and does not require the generation and analysis of graphic representations or signatures of the bonding current or the selection of logic levels as has been required in the prir art.

A feature of the novel missing wire detector is the criteria, Bond Quality Rating, for designating a bond as being either good or unacceptable may be altered by the operator of the bonding machine. Thus, it is possible to sensitize or desensitize the detection of either good or unacceptable bonds depending on the bond quality specifications and/or the yield objectives of the bonding operations.

Another feature of the novel missing wire detector is its adaptive tracking of bond quality rating (BQR) statistics. The actual BQR value is dependent on the quality of the bond, but is also dependent on the nature of the bonding surface, the bonding parameters, the operational characteristics of the bonding machine as well as gradual changes in the characteristics of the bonding machine which cause shifts in the BQR distribution. The BQR values which are more recently acquired are added to the average BQR while the BQR value for bonds made a considerable time in the past are gradually dropped from the statistics so that their effect is made increasingly less significant.

We claim:

1. Apparatus for monitoring the bond condition of fine wire being ultrasonically bonded to a bonding pad comprising:
   an ultrasonic transducer,
   an ultrasonic generator coupled to said transducer,
   a wedge bonding tool mounted in said transducer,
   a fine wire threaded in said wedge bonding tool and having a wire tail positioned under the working face of said wedge bonding tool,
   means for measuring and storing a plurality of frequency readings indicative of the frequency of said ultrasonic generator when said wedge bonding tool is wedge bonding said fine wire to said bonding pad, and
   means for calculating a bond quality rating related to the frequency shift of said plurality of said frequency readings.

2. Apparatus for monitoring the bond condition as set forth in claim 1 wherein said means for measuring and storing comprises a stable source of pulses,
   means for measuring a predetermined number of cycles from said ultrasonic generator to provide a variable time interval,
   counter means coupled to said means for measuring a predetermined number of cycles for starting and stopping said counter means, and
   said stable source of pulses being coupled to said counter means for clocking said counter means during said variable time interval and generating a count output indicative of the frequency of said ultrasonic generator when a fine wire is being bonded to a bonding pad.

3. Apparatus for monitoring the bond condition as set forth in claim 2 which further includes register means for storing said count output from said counter means.

4. Apparatus for monitoring the bond condition as set forth in claim 3 wherein said register means comprises a plurality of latches for alternately storing said count outputs from said counter means.

5. Apparatus for monitoring the bond condition as set forth in claim 3 wherein said register means is coupled to said means for calculating a bond quality rating and comprises a processor having memory means for storing said plurality of frequency readings and for calculating and storing said bond quality ratings.

6. Apparatus for monitoring the bond condition as set forth in claim 5 wherein a plurality of bond quality ratings are stored in said memory means of said processor for computing the average and the standard deviation of the bond quality ratings for a plurality of bonds.

7. Apparatus for monitoring the bond condition as set forth in claim 6 wherein said processor is adapted to compare the bond quality ratings of each new bond with said average and said stndard deviation of the stored bond quality ratings for previous good bonds to determine if a good bond has been made.

8. Apparatus for monitoring the bond condition as set forth in claim 7 wherein said processor is adapted to generate a bond monitor signal indicative of whether the bond being made is good or bad.

* * * * *